US011023077B2

(12) United States Patent
Morrison et al.

(10) Patent No.: US 11,023,077 B2
(45) Date of Patent: Jun. 1, 2021

(54) SYSTEM AND METHOD OF CONTROLLING AN ELECTROPERMANENT MAGNET AT A TRACKPAD

(71) Applicant: Dell Products, LP, Round Rock, TX (US)

(72) Inventors: Jason S. Morrison, Chadron, NE (US); Laurent A. Regimbal, Georgetown, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/450,269

(22) Filed: Jun. 24, 2019

(65) Prior Publication Data

US 2020/0401295 A1    Dec. 24, 2020

(51) Int. Cl.
| | | |
|---|---|---|
| G06F 3/02 | (2006.01) | |
| G09G 5/00 | (2006.01) | |
| H03K 17/972 | (2006.01) | |
| H01H 36/00 | (2006.01) | |
| H01F 7/06 | (2006.01) | |
| H01F 7/02 | (2006.01) | |
| G06F 3/041 | (2006.01) | |
| H01H 21/24 | (2006.01) | |
| H01F 7/04 | (2006.01) | |
| H03K 17/96 | (2006.01) | |
| G06F 3/044 | (2006.01) | |
| G06F 3/045 | (2006.01) | |
| G06F 1/16 | (2006.01) | |

(52) U.S. Cl.
CPC .......... *G06F 3/04186* (2019.05); *G06F 3/044* (2013.01); *G06F 3/045* (2013.01); *H01F 7/04* (2013.01); *H01H 21/24* (2013.01); *H03K 17/962* (2013.01); *G06F 1/1616* (2013.01); *H01H 2221/032* (2013.01); *H01H 2239/03* (2013.01)

(58) Field of Classification Search
CPC ......... G06F 3/016; G06F 3/041; G06F 3/0338
See application file for complete search history.

(56) References Cited

U.S. PATENT DOCUMENTS

| 2005/0231313 A1* | 10/2005 | Shahoian | .................. H01F 7/16 335/220 |
| 2018/0315563 A1* | 11/2018 | Morton | .................. H01F 7/021 |

* cited by examiner

*Primary Examiner* — Nan-Ying Yang
(74) *Attorney, Agent, or Firm* — Prol Intellectual Property Law, PLLC; H. Kenneth Prol

(57) ABSTRACT

An information handling system may include a processor to receive input from a trackpad at the information handling system, from a user; and an electropermanent magnet control system to control the activation of an electropermanent magnet (EPM) magnetically couplable to the trackpad to influence the force of actuation.

20 Claims, 10 Drawing Sheets

SYSTEM AND METHOD OF CONTROLLING AN ELECTROPERMANENT MAGNET AT A TRACKPAD

FIELD OF THE DISCLOSURE

The present disclosure generally relates to a keyboard trackpad assembly and other input/output devices of an information handling system. The present disclosure more specifically relates to the use of electropermanent magnets in a trackpad assembly or other input/output devices.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard, trackpad, or other input/output (I/O) device for manual input of information by the user.

BRIEF DESCRIPTION OF THE DRAWINGS

The accompanying drawings illustrate various examples of the principles described herein and are part of the specification. The illustrated examples are given merely for illustration, and do not limit the scope of the claims.

Figure 1:
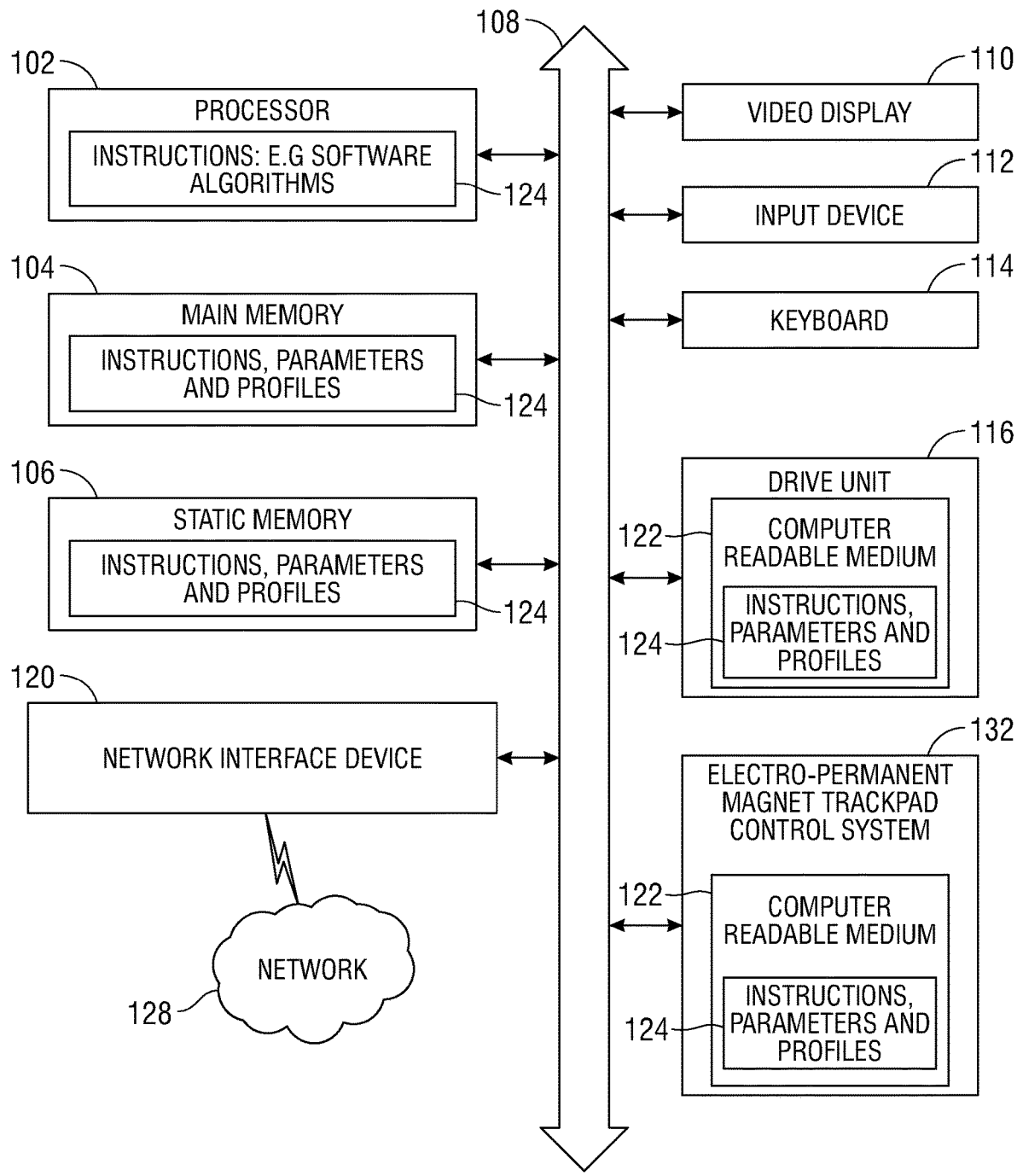
FIG. 1 is a block diagram illustrating an information handling system according to an embodiment of the present disclosure.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for an information handling system that includes an input/output (I/O) device such as a trackpad or a keyboard. For example, a trackpad may be any type of device that receives tactile input from a user and translates any actuation, including pressing motions against, tapping motions on, and translation motions across the surface of the trackpad as input to the information handling system. A keyboard may be any number of key assemblies for registering a keystroke as an input. The present disclosure describes the use of an electropermanent magnet (EPM) to provide an actuation-resistive force against, in an embodiment, any pressure presented by a user against the surface of the trackpad or of a key. In an embodiment, the actuation-resistive force is produced by actuation of the EPM as it is "activated." In the present disclosure and in the appended claims, "actuation" of the EPM is meant to be understood as causing the magnetic flux of the EPM to be increased. In an embodiment, the magnetic flux of the EPM is increased by selectively applying a current pulse to any of a plurality of electrically conductive wires coiled around a low-coercivity magnets within the EPM. Via the application of a current pulse to any of the electrically conductive wires, the polarity of the low-coercivity magnets may be aligned to that of a high-coercivity magnet within the EPM. This, in turn, increases the overall magnetic flux of the EPM.

In some embodiments of the present disclosure, the EPM may include any number of high-coercivity magnets and a plurality of low-coercivity magnets. In this example embodiment, the actuation-resistive force provided by the EPM may be incrementally increased as each individual low-coercivity magnet is activated as described herein. Such an EPM may be referred to as a multi-level EPM in various embodiments herein whereas an EPM may refer to a single level EPM or a multi-level EPM in embodiments herein. In a specific example of the present disclosure, a multi-level EPM may include a single high-coercivity magnet surrounded by four low-coercivity magnets. In this embodiment, the magnetic field of the multi-level EPM may be increased in four incremental degrees. This is specifically done by sending a first current pulse to a first electrically conductive wire coiled around a first low-coercivity magnet. As described herein, this causes the polarity of the low-coercivity magnet to be aligned with the polarity of the high-coercivity magnet thereby increasing the magnetic field of the multi-level EPM by one increment. The same process may continue with the second, third, and fourth low-coercivity magnet resulting in an incremental magnetic field increase after each activation of each low-coercivity magnet.

In an embodiment, the information handling system may include a processor that receives user-defined actuation characteristics. The user-defined actuation characteristics may describe the actuation force used to actuate the trackpad. In this embodiment the actuation force may be the force used to push on the trackpad, at a certain location, in order to cause a click operation to be recorded by the information handling system. This click operation may be similar to the click operation on a mouse device. In this embodiment, the user may define how much force is used to actuate the trackpad by, via the user-defined actuation characteristics, in order to complete the click operation.

In an embodiment the trackpad of the information handling system may include a number of flanges onto which a permanent magnet is coupled. In this embodiment the permanent magnets on the flanges may be selectively repulsed by an EPM when, and to what extent, the EPM is activated. By doing so, the trackpad may be physically repulsed by the EPM when the EPM is activated so as to create the actuation force used by a user to engage in a click operation as described herein. In an embodiment, a housing around the trackpad may prevent the trackpad from rising up and away from the EPM thereby preventing the trackpad from passing above a pane of a keyboard or other surface of the housing of the trackpad.

In previous systems, mechanical elements that implement rigid, high-quality materials such as stainless steel and glass may be used to create a consistent actuation force and/or displacement of the trackpad. However, the cost of these additional materials may increase the cost of the information handling system. Additionally, the potential for the materials to degrade over time reduces the user satisfaction in relation to the information handling system.

Additionally, previous systems did not allow for the actuation force of the trackpad to be customized. This is because the materials used to counter the force applied by a user provide for a single opposing force without taking the trackpad apart and either supplement the materials used or switch out the materials used to create the opposing force.

Embodiments of the present disclosure address this issue by incorporating the EPMs as described. Here, the EPMs allow for a consistent and user-defined actuation force presented at the actuation points along the trackpad. By incorporating the EPMs in the fashion described herein, the cost of the materials used in connection with the trackpad are reduced thereby reducing the costs of the information handling system as well. Additionally, because the user may define the actuation forced used to actuate the trackpad having a multi-level EPM in some embodiments, the tactile characteristics of the trackpad may be modified resulting in user satisfaction. Still further, the use of the EPMs may reduce any degradation of components of the trackpad causing the actuation force of the trackpad to be maintained throughout the use of the information handling system.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a land-line telephone, a control system, a camera, a scanner, a facsimile machine, a printer, a pager, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a trackpad, a keyboard, a mouse, a video/graphic display, a touchscreen or any combination thereof. The information handling system can also include one or more buses operable to transmit communications between the various hardware components. Portions of an information handling system may themselves be considered information handling systems.

Information handling system 100 can include devices or modules that embody one or more of the devices or execute instructions for the one or more systems and modules described above, and operates to perform one or more of the methods described above. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 can include memory such as main memory 104, static memory 106, computer readable medium 122 storing instructions 124 of the electropermanent magnet trackpad control system 132 or a control system for other EPM assisted I/O devices, and drive unit 116 (volatile (e.g. random-access memory, etc.), nonvolatile (read-only memory, flash memory etc.) or any combination thereof). The information handling system 100 can also include one or more buses 108 operable to transmit communications between the various hardware components such as any combination of various input and output (I/O) devices.

As shown, the information handling system 100 may further include a video display 110. The video display 110 in an embodiment may function as a liquid crystal display (LCD), an organic light emitting diode (OLED), a flat panel display, a solid-state display, or a cathode ray tube (CRT). Additionally, the information handling system 100 may include an input device 112, such as a cursor control device (e.g., mouse, trackpad, touchpad, or gesture or touch screen input, and a keyboard 114). The information handling system 100 can also include a disk drive unit 116.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both license and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz). It is understood that any number of available channels may be available under the 5 GHz shared communication frequency band. WLAN, for example, may also operate at a 2.4 GHz band. WWAN may operate in a number of bands, some of which are proprietary but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well.

In some embodiments, software, firmware, dedicated hardware implementations such as application specific integrated circuits, programmable logic arrays and other hardware devices can be constructed to implement one or more of some systems and methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 can communicate voice, video or data over the network 128. Further, the instructions 124 may be transmitted or received over the network 128 via the network interface device or wireless adapter 120.

The information handling system 100 can include a set of instructions 124 that can be executed to cause the computer system to perform any one or more of the methods or computer-based functions disclosed herein. For example, instructions 124 may execute an electropermanent magnet trackpad control system 132 or a control system for other EPM assisted I/O devices, software agents, or other aspects or components. Various software modules comprising application instructions 124 may be coordinated by an operating system (OS), and/or via an application programming interface (API). An example operating system may include Windows®, Android®, and other OS types known in the art. Example APIs may include Win 32, Core Java API, or Android APIs.

The disk drive unit 116 and the electropermanent magnet trackpad control system 132 or a control system for other EPM assisted I/O devices may include a computer-readable medium 122 in which one or more sets of instructions 124 such as software can be embedded. Similarly, main memory 104 and static memory 106 may also contain a computer-readable medium for storage of one or more sets of instructions, parameters, or profiles 124 including an estimated training duration table. The disk drive unit 116 and static memory 106 also contain space for data storage. Further, the instructions 124 may embody one or more of the methods or logic as described herein. For example, instructions relating to the electropermanent magnet trackpad control system 132 or a control system for other EPM assisted I/O devices software algorithms may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the electropermanent magnet trackpad control system 132 or a control system for other EPM assisted I/O devices may be executed locally or remotely. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The electropermanent magnet trackpad control system 132 or a control system for other EPM assisted I/O devices may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include an electropermanent magnet trackpad control system 132 or a control system for other EPM assisted I/O devices that may be operably connected to the bus 108. The electropermanent magnet trackpad control system 132 or a control system for other EPM assisted I/O devices may be stored on computer readable medium 122 and may also contain space for data storage. The electropermanent magnet trackpad control system 132 or a control system for other EPM assisted I/O devices may perform tasks related to controlling the magnetic field generated by an electropermanent magnet within a trackpad assembly, or turning EPMs from an on state to an off state or vice-versa at the trackpad. In some embodiments, a current level in a plurality of low-coercivity magnets may correspond to a user-selected magnitude when a stepped electro-permanent magnet system is used.

In an embodiment, the electropermanent magnet trackpad control system 132 or a control system for other EPM assisted I/O devices may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Trackpad/touchpad, touchscreen, keyboard, or mouse driver software, firmware, controllers and the like may communicate with applications on the information handling system.

Figure 2:
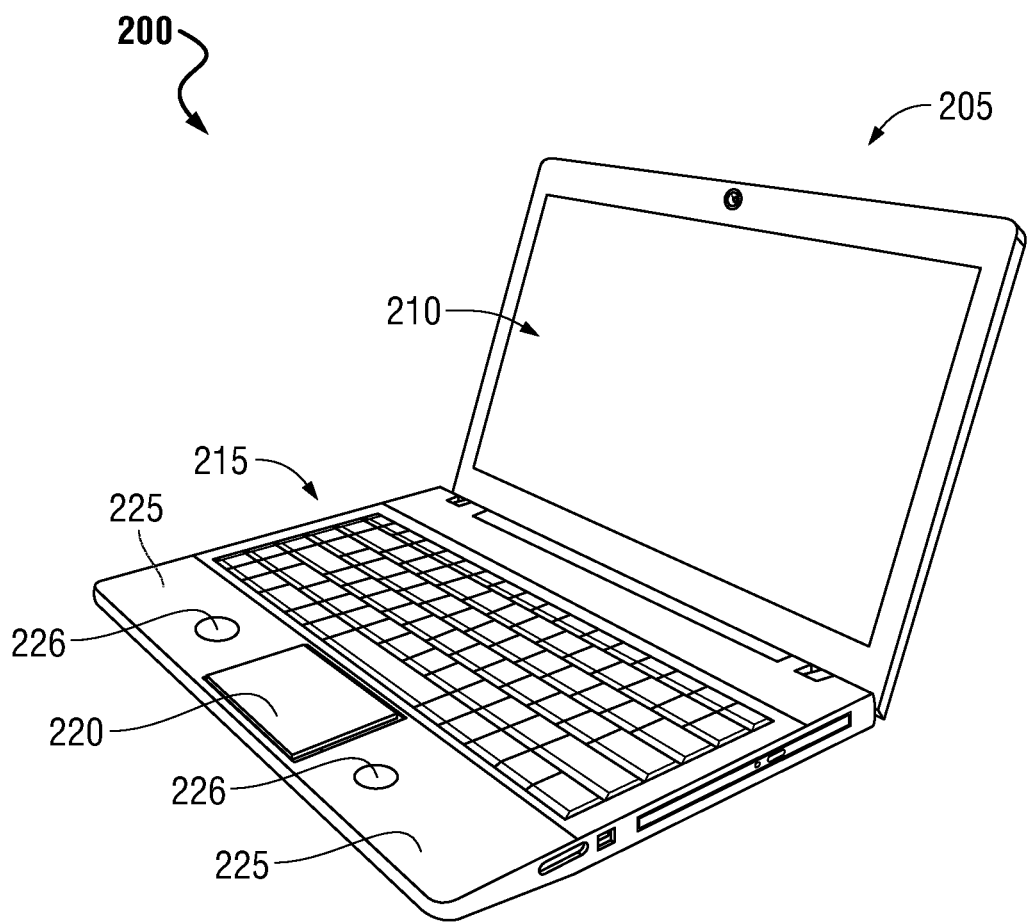
FIG. 2 is a block diagram of an information handling system including I/O devices according to an embodiment of the present disclosure.

FIG. 2 is a block diagram of an information handling system with electropermanent magnet trackpad control system 200 according to an embodiment of the present disclosure. Although FIG. 2 depicts the information handling system 205 as being implemented in a laptop computing device, FIG. 2 is not meant to be limiting and the present specification contemplates that the use of other types of information handling system as described herein. In the example, the information handling system 205 may include a screen portion 210 and a keyboard portion 215. The screen portion 210 may include any device that can present to a user any visual data as output to a user in response to input and execution of the instructions, parameters, and profiles 124 by the processor 102 described in connection with FIG. 1. Further, screen portion 210 may include a touch sensitive touchscreen in some embodiments. In an example, a graphical user interface may be presented to a user to input any number of parameters descriptive of the actuation force used to actuate a trackpad 220, any number of keys present on the keyboard portion 215, or a touchscreen of the information handling system 205 in various embodiments.

The keyboard portion 215 may include any number of keys arranged in any manner so as to receive input from a user via selective actuation of those keys. In an embodiment, the keys may be arranged similar to a QWERTY-type keyboard layout or any other alphabetic, symbolic, and/or numeric layout. In an embodiment, the keys may be any number of keys from 1 to infinity. Keys of keyboard portion 215 may be associated with an EPM in a magnetic keyboard assembly utilizing EPMs according to various embodiments herein. In an embodiment, keyboard portion 215 may also include trackpad 220 framed by areas of keyboard portion on either side or along an edge of trackpad 220 that may serve as palm rests 225 in the c-cover for information handling system 205 shown as a laptop computing device. Located under palm rests 225, the information handling system 205 may have one or more proximity sensor to detect palms resting on palm rests 225. In one example embodiment, the proximity sensors may be located at or about 226 on palm rests 225 and may be capacitive, resistive, infrared, light, hall effect, or other sensors to detect proximity of a user's palms on palm rests 225.

In an embodiment of the present description of the information handling system 200 may include trackpad 220 to receive input from a user as described herein. The trackpad 220 may be associated with an EPM to attract or repel a trackpad support plate depending on configuration such that downward actuation force is required to engage a switch or pressure sensor (not shown) situated below the trackpad 220 on a trackpad or information handling system chassis. In an embodiment, the trackpad 220 or other I/O devices may utilize a multi-level EPM in some particular embodiments. The EPM may be used to selectively attract or repel a permanent magnet coupled to a flange on the substrate of the trackpad 220 as described herein. The EPM may selectively attract or repel the permanent magnet, and the trackpad, through application of a current pulse to an electrically conductive wire coiled around a low-coercivity magnet placed with a high-coercivity magnet. In other embodiments, the EPM may be used to attract or repel a ferromagnetic flange extension of the trackpad support plate. Application of this current pulse causes the poles of the low-coercivity magnet to line up with the poles of the high-coercivity magnet. In such an embodiment, the magnetic fields of the high-coercivity magnet and the low-coercivity magnets may compound to generate a magnetic field having a magnitude greater than that of either the high-coercivity magnetic field or the low-coercivity magnetic field alone. This compounded magnetic field may be arranged so as to selectively repel the flange away from the EPM thereby causing the trackpad to raise away from the EPM and impose a resistive force to any actuation of the trackpad. This places the EPM in an "on" state or otherwise "activates" the EPM. Accordingly, when an opposite voltage is applied to the electrically conductive coil, a current pulse is passed through the electrically conductive coil resulting in the poles of the magnetic field generated by the low-coercivity magnets being placed in a magnetic state opposite the poles of the magnetic field generated by the high-coercivity magnet. This results in the EPM being placed in an "off" state or an "deactivated" state thereby being rendered incapable of sufficiently repelling the permanent magnet coupled to the flange of the trackpad. In this "off" state, the trackpad 220 may be rendered inoperable, that is, incapable of receiving input from a user via actuation of the, now, recessed trackpad. In some embodiments, a multi-level EPM may be used with a plurality of low-coercivity magnets. Each of the plurality of low-coercivity magnets may be selectively activated or deactivated such that their magnetic poles align or oppose one or more high-coercivity magnets in the multi-level EPM. In this way, the multi-level EPM may incrementally raise or lower magnetic flux levels. This provides for an off-state and a plurality of on states depending on the number of low-coercivity magnets in some embodiments. Alignment of magnetic fields, opposite alignment of magnetic fields, or attraction of a ferromagnetic material may occur in an on state of an EPM in some example embodiments.

The information handling system 205 may include an electropermanent magnet trackpad control system 132 or a control system for other EPM assisted I/O devices as described herein. In an embodiment, the electropermanent magnet trackpad control system 132 or a control system for other EPM assisted I/O devices may include one or more sets of instructions that, when executed by a processor, causes an initial current pulse to be applied to an electrically conductive wire coiled around a low-coercivity magnet among a plurality of low-coercivity magnets within the multi-level EPM as described herein. The one or more sets of instructions of the electropermanent magnet trackpad control system 132 or a control system for other EPM assisted I/O devices may also include one or more sets of instructions that, when executed by a processor, causes any subsequent current pulse to be applied to a second electrically conductive wire coiled around a second low-coercivity magnet. In this manner, the low-coercivity magnets within the multi-level EPM may be selectively activated or placed in an "on" state. This allows the multi-level EPM to incrementally increase the magnitude of the magnetic field created by the multi-level EPM. This, consequently, allows for the customization of an actuation force used by a user to actuation the trackpad. Accordingly, the magnitude of the magnetic field may be incrementally increased based on the materials used to form the low-coercivity magnets as well as the number of low-coercivity magnets within the multi-level EPM. In an embodiment, the number of low coercivity magnets within the multi-level EPM may be four allowing for four distinct and incremental increases/decreases in the magnitude of the magnetic field of the multi-level EPM.

In an embodiment, the electropermanent magnet trackpad control system 132 or a control system for other EPM assisted I/O devices may also include one or more sets of instructions that, when executed by the processor, causes current pulses to be applied to multiple electrically conductive wire coils each coiled around respective numbers of low-coercivity magnets. This allows the electropermanent magnet trackpad control system 132 or a control system for other EPM assisted I/O devices to set the resistive force realized by the activation of the EPM based on a user-defined actuation force data. In this example, a processor of the information handling system 205 may receive and send this user-defined actuation force data to the electropermanent magnet trackpad control system 132 or a control system for other EPM assisted I/O devices so that the electropermanent magnet trackpad control system 132 or a control system for other EPM assisted I/O devices may control which and how many of the electrically conductive wire coils are to receive a current pulse in order to align the polarity of which and how many of the low-coercivity magnets within the multi-level EPM should be activated or set to an "on" state.

In an embodiment, the electropermanent magnet trackpad control system 132 or a control system for other EPM assisted I/O devices may also include one or more sets of instructions that, when executed by the processor, causes the activation of the multi-level EPM and, specifically, the low-coercivity magnets, based on the type of computer application being executed by the processor of the information handling system. By way of example, a user may be engaged in providing input, via the trackpad 220 of the keyboard portion 215, to a processor of the information handling system 205 in order to cause output to be provided. In a specific example, this may be in the form of an interaction with a game being executed on the information handling system 205. During engagement with the game play, the actuation force used to actuate the trackpad 220 may be adjusted based on that gaming application being executed. Upon these scenarios or occurrences, the processor may receive instructions to selectively disable, enable, or change the actuation force associated with the trackpad 220 in real-time. The reasons as to if and when the trackpad 220 is enabled, disabled, and/or has its actuation force changed may be dependent on the input provided to the information handling system 205 upon execution of the application (such as the gaming application in this embodiment) as well as the output provided by that execution of the application.

Figure 3:
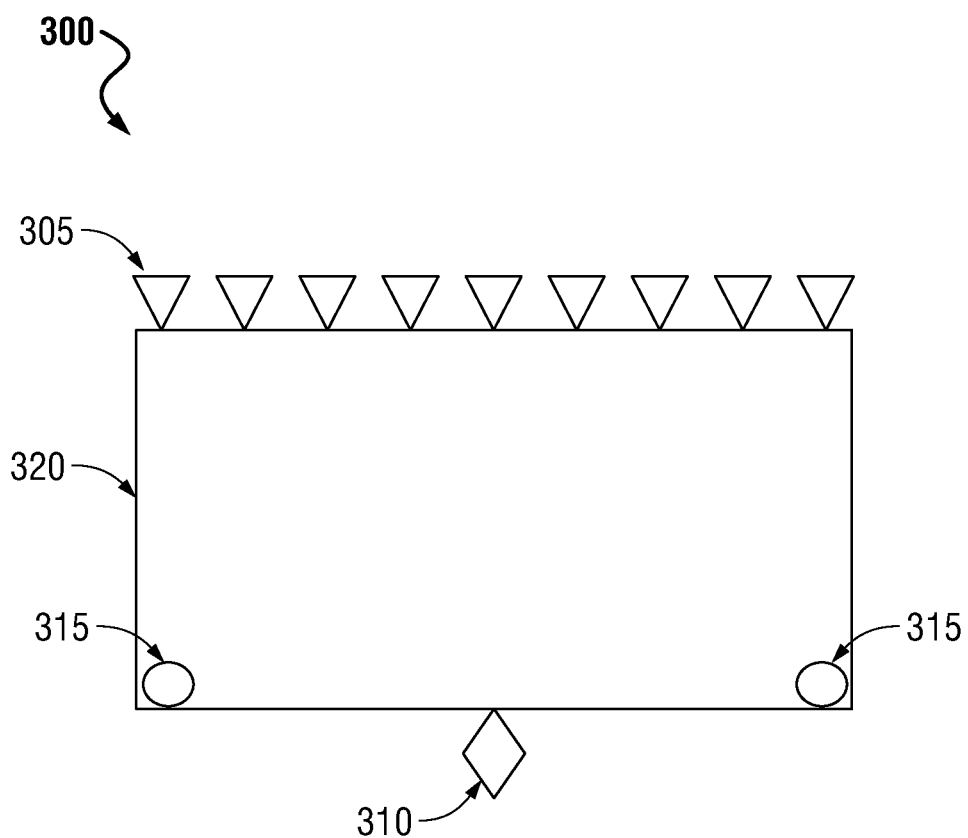
FIG. 3 is a block top-view of a trackpad system according to an embodiment of the present disclosure.

FIG. 3 is a block top-view of a trackpad system 300 according to an embodiment of the present disclosure. The trackpad system 300, in an embodiment, may form part of a keyboard portion on, for example, a laptop computing device. The trackpad system 300 may include a trackpad 320. The trackpad 320 may be any surface that can receive, at least, user input via actuation of the trackpad 320 by pressing down on the trackpad 320 as well as X-Y input data via a touch sensor layer such as a capacitive touchpad or other touch sensing mechanism. In an example, the actuation of the trackpad 320 may be similar to that of a mouse in that a user pressing down on the left side of the trackpad 320 results in similar input as a left-click on a mouse device. Similarly, for the right side of the trackpad 320: pressing down on the right side of the trackpad 320 results in similar input as a right-click on a mouse device. Thus, in an embodiment, along with a touch sensitive surface, the trackpad 320 is capable of determining a location of a user's finger at the time that the user pushes on the trackpad 320 such that a processor to which the touch and actuation signals is sent to may determine whether the actuation was at a left or right location of the trackpad 320. An actuation sensor or click module may be located at 310 in some embodiments in the center such that the X-Y location of left or right press location may determine a left-click or right-click.

In an embodiment of the present disclosure, the trackpad 320 may be formed of a number of layers such as a substrate and a touch sensitive surface (i.e., capacitive or resistive surface). In this embodiment, the trackpad 320 may receive input from a user not only via pressing down on the trackpad 320 as described, but also via touching and/or translating the users' finger across the surface of the trackpad 320. Although the present specification describes a trackpad 320 that includes this touch-sensitive surface, the present specification contemplates that the trackpad 320 receives input, at least, via the actuation force used to press down on certain locations along the trackpad 320 as described. Thus, in some embodiments, the trackpad 320 may be capable of detection a certain deflection of the body of the trackpad 320 in order to determine which portion (i.e., left or right portion) of the trackpad 320 was actuated.

The trackpad 320 may be secured to a housing of the trackpad system 300 and/or the information handling system via any number of support members 305. As depicted in FIG. 3, the trackpad 320 includes, as the support members 305 any number of hinging support members 305. The hinging support members 305 may couple the trackpad 320 to a chassis or housing of the trackpad system 300 and allow the trackpad 320 to selectively hinge about the interface between the chassis and the trackpad 320. After being actuated, the trackpad 320 may be returned to an unactuated position through the use of a spring or other temporarily flexibly device or material. By hinging the trackpad 320 to the chassis using the hinging support members 305, a user may be allowed to press on a distal edge of the trackpad 320 opposite the edge coupling the trackpad 320 to the chassis via the hinging support members 305. By actuation of the distal edge of the trackpad 320, a user may provide input to, for example, a processor of an information handling system as described in some embodiments herein. The trackpad system 300 may be actuated by a switch mechanism that is detected when the trackpad is deflected while supported by the hinging support members 305. The switch mechanism may be located beneath the trackpad 320. The switch mechanism may provide a traditional click response in some embodiments with a mechanically actuated switch. The operation of the deflection of trackpad 320 may be controlled and force required to deflect the trackpad 320 may be adjusted via use of EPM configurations according to embodiments herein.

In an embodiment, among the support members 305 may also be an actuation point 310. The actuation point 310 may be placed, in this embodiment, at a midpoint along the distal edge of the trackpad 320. In an embodiment, the actuation point 310 allows the actuation of the trackpad 320 to be detected via, for example, a pressure sensor, switch sensor, or other sensor as is used to detect deflection of such a trackpad system. For example, the mechanical deflection of trackpad 320 may engage a pressure or mechanical switch sensor and provide a click response in an embodiment. In some embodiments, the most deflection of the trackpad 320 may occur near or at extreme distal left and right locations 315. Thus, during operation, a user may actuate a distal-left and/or distal-right location on the trackpad 320 by pressing down on the trackpad 320 at those locations. When, for example, the track pad 320 on the left half near or at the distal-left actuation point 315 is pressed by the user, the trackpad system 300 may interpret that action as being similar to a left-click on a mouse device. Similarly, the opposite is the case with the distal-right actuation: when the track pad 320 on the left half near or at the distal-right actuation point 315 is pressed by the user, the trackpad system 300 may interpret that action as being similar to a right-click on a mouse device. However, in an embodiment, an actuation at, for example, the distal-left location of the trackpad 320 prevents the trackpad 320 from registering an actuation on the distal right location on the trackpad 320. In an embodiment, the touch-sensitive surface may provide additional information as to where the user's finger was placed (i.e., in x, y coordinate data, for example) at the time the actuation point 310 detected the actuation of the trackpad 320.

In a specific embodiment, the actuation point 310 may be a tact switch that provides support to the trackpad 320 until a certain force applied causes a "click" to be registered at the trackpad 320. In this example, the force used to cause a click may be about 1.5N. Thus, in this example, the trackpad 320, through the touch-sensitive surface, may determine a location of the user's finger in an x- and y-direction while the tact switch registers the "click" or selection of a graphic represented on a screen of the information handling system. Consequently, in this embodiment, the tact switch may be used to provide both support to the trackpad 320 at a center pivot point between the left and right locations 315 while also being capable of registering user input when sufficient force is applied to the surface of the trackpad 320 by the user. The tactile click switch may be set at any force level for registration of a "click", 1.5 N is merely one example.

As described herein, the trackpad 320 may include any number of EPMs located below a surface of the trackpad 320. In any embodiment presented herein, the EPMs may be located at a location relative to the trackpad 320 so as to magnetically interface with a portion of the trackpad 320 as described herein. In an example, the trackpad 320 may include a metallic or ferromagnetic "dive board" that forms a lower layer of the trackpad 320 so that the EPMs may interact with the metallic or ferromagnetic layer during operation of the trackpad system 300 described herein.

In an embodiment, the trackpad may include a substrate onto which, for example, a touch sensitive surface is applied. The substrate may be made of any material that allows a user to interact with the trackpad system 300 as described herein. In an example, the substrate may be made of a resilient metal that allows the user to temporarily bend the metal out of a planar shape such that when force against the substrate is released, the metal returns to its original planar shape.

In an embodiment, the substrate may include any number of permanent magnets coupled thereto that interact with a respective EPM. In the example shown in FIG. 3, the trackpad 320 may include two EPMs with permanent magnets placed within a potential magnetic field created by the EPMs. The strength of the permanent magnet may be sufficient such that, upon interaction with the magnetic field created by the EPM, it creates some attractive force or repelling force between the permanent magnet/substrate and the EPM. As described herein in some embodiments, because the magnitude of the magnetic field of a multi-level EPM may be increased/decreased, incrementally, the attractive force or repelling force may be increased/decreased incrementally which corresponds to an incremental increase/decrease in the actuation force a user implements in order to overcome this resistive force. Although the present embodiments describe, specifically, a attractive force being placed between the permanent magnet/substrate and the multi-level EPM, the present description contemplates that the multi-level EPM can selectively create an attractive force or repelling force between the permanent magnet/substrate and the multi-level EPM. In these examples, the multi-level EPM may be designed such that the multi-level EPM has multiple discrete magnetic field levels and polarities to either attract or repel the permanent magnet depending on, in an example, the modifications made to the magnitude of the magnetic field of the multi-level EPM 315 and/or permanent magnet. The EPM may be located above the dive board of trackpad 320 under the c-cover or under the dive board of the trackpad 320. The location may determine whether an attractive or repelling force is used to control force needed to actuate the trackpad or to turn off the trackpad such that it is not able to be depressed. The multi-level EPM may be designed such that the placement of the EPMs either above or below the substrate of the trackpad 320 (i.e., the dive board) determines whether the EPM is to attract or repel (respectively) that dive board so as to selectively prevent actuation of the trackpad 320 based on whether a touch from a user (i.e., touch by a finger rather than a palm) is detected or not.

By including the multi-level EPM and permanent magnets into the trackpad system 300, the trackpad system 300 may be capable of overcoming any variations in the materials and their fabrication processes that are implemented in the trackpad system 300. For example, the substrate of the trackpad 320, being made of a resilient metal or material, may have variances in the resiliency such that among different manufactured trackpads 320 or even in a particular trackpad, the resiliency of the material of the substrate may divergent from an expected resiliency. In this case, the trackpad system 300 may, via execution of computer-readable instructions by a processor, determine a benchmark actuation force to be set so as to overcome these material and/or fabricated differences. Adjustments to current supplied to a coil or coils of an EPM or multi-level EPM respectively may also be used to adjust magnetic flux levels to a lesser degree at one or more incremental magnetic flux levels. For example, greater or less current to a magnetic coil may be used to adjust the saturation level of polarity switch of one or more low-coercivity magnets such that an adjustment may be made in accordance with a benchmark actuation force.

Still further, by including the multi-level EPM and permanent magnet into the trackpad system 300, the actuation force used by the user to actuate the trackpad 320 may be interactively set by the user in order to achieve a desired actuation force in some embodiments. Indeed, as described herein, the processor may receive input from the user indicative of a desired lever of actuation force in relation to the trackpad 320. This actuation force may be incrementally adjusted based on the number of low-coercivity magnets within the multi-level EPM that have their polarity aligned with each other and/or the high-coercivity magnet(s) of the multi-level EPM.

Unlike other systems, the presently-described trackpad system 300 also prevents errant "clicks" or actuations of the trackpad 320 through the use of the EPMs and, in an example, the attracting or repelling force the EPMs apply to a metallic or ferromagnetic layer of the trackpad 320 and/or a permanent magnet mechanically coupled to the trackpad 320. In an embodiment, the trackpad system 300 may also detect whether a human touch is detected on a touch sensitive surface of the trackpad 320 and reject any input if the human touch is not detected. This is true even when an object presses against the trackpad 320 causing, what would have otherwise been detected as a "click" by a human, as being an errant pressing of the trackpad 320 surface. Either the force required for a "click" may be increased to make a click difficult or inoperable at a highest level of a multi-level EPM, or the EPM may be de-activated so as to not accept click inputs. In some examples, no attracting or repelling force may be available in an off-state such that no downward deflection is allowed. In some embodiments, a contact switch or pressure sensor may also be deactivated.

Additionally, with the inclusion of the EPMs and metallic/ferromagnetic and/or permanent magnets into the trackpad system 300, the costs of manufacturing the information handling system described herein may be reduced. In an example, the trackpad system 300 described herein may eliminate some elements currently being used by some trackpad systems thereby reducing costs in materials and assembly. Even further, because the permanent magnet and EPM do not degrade over time, the operative lifetime of the information handling system and specifically the trackpad system 300 may be increased relative to those other systems. This may be because the mechanical parts used in other trackpad systems may degrade over time rendering the trackpad system inoperative. Consequently, through use of the presently described trackpad system 300, user satisfaction may be increased while costs to the manufacturer and user-purchaser are also reduced.

In any embodiment, the trackpad system 300 may include, along with the EPM, any other device that provides tactile or haptic feedback to a user implementing the trackpad system 300. The track pad system 300, for example, may include the EPM located at an edge of the track pad near the distal corner edges 315 of the track pad 320 such as extending from the trackpad corner at one or both of locations 315. In an embodiment, the trackpad system 300 may further include one or more tactile switches (not shown). The tactile switches may be any device that provides tactile feedback to a user when the user actuates the trackpad 320 by pressing down on it. Additionally, or alternatively, the tactile switch may provide input to a processor indicating that the trackpad 320 has been actuated. In some embodiments, the tactile switches may include a spring for momentary switch action and a click response. In this embodiment, the spring system and click response may provide tactile feedback to a user when sufficient force has been placed on the trackpad 320.

In another embodiment, the trackpad 320 may include one or more external springs to release a touch sensor after a touch event at the trackpad 320 is registered (i.e., via a touch detection layer on the trackpad 320). In this embodiment, the external springs may release the external springs in order to enable the momentary action of the tactile switches.

In an embodiment, the tactile switches may be one or more single-pole single-throw (SPST) switch that make electrical contact when depressed (closed when activated) and that normally make no electrical contact (normally open). It may be appreciated that in different embodiments, different types and polarities may be used for the tactile switches, such as normally closed, for example. Other tactile switches may be used and the present specification contemplates that any device or switch may be used to provide tactile feedback to a user along with the EPMs described herein so as to provide for both a resistance (via the EPMs 315, for example) at the trackpad 320 as well as an indication (via the tactile switches, for example) to the user that the trackpad 320 was depressed. Additionally, by implementing the tactile switches with the EPMs described herein, the trackpad 320 may both an indication (via the tactile switches, for example) to the user that the trackpad 320 was depressed as well as user-customizable resistance to the actuation of the trackpad 320 (i.e., pressing of the trackpad 320) through variations in the actuations of the low-coercivity magnets within the EPM itself as described herein.

Figure 4A:
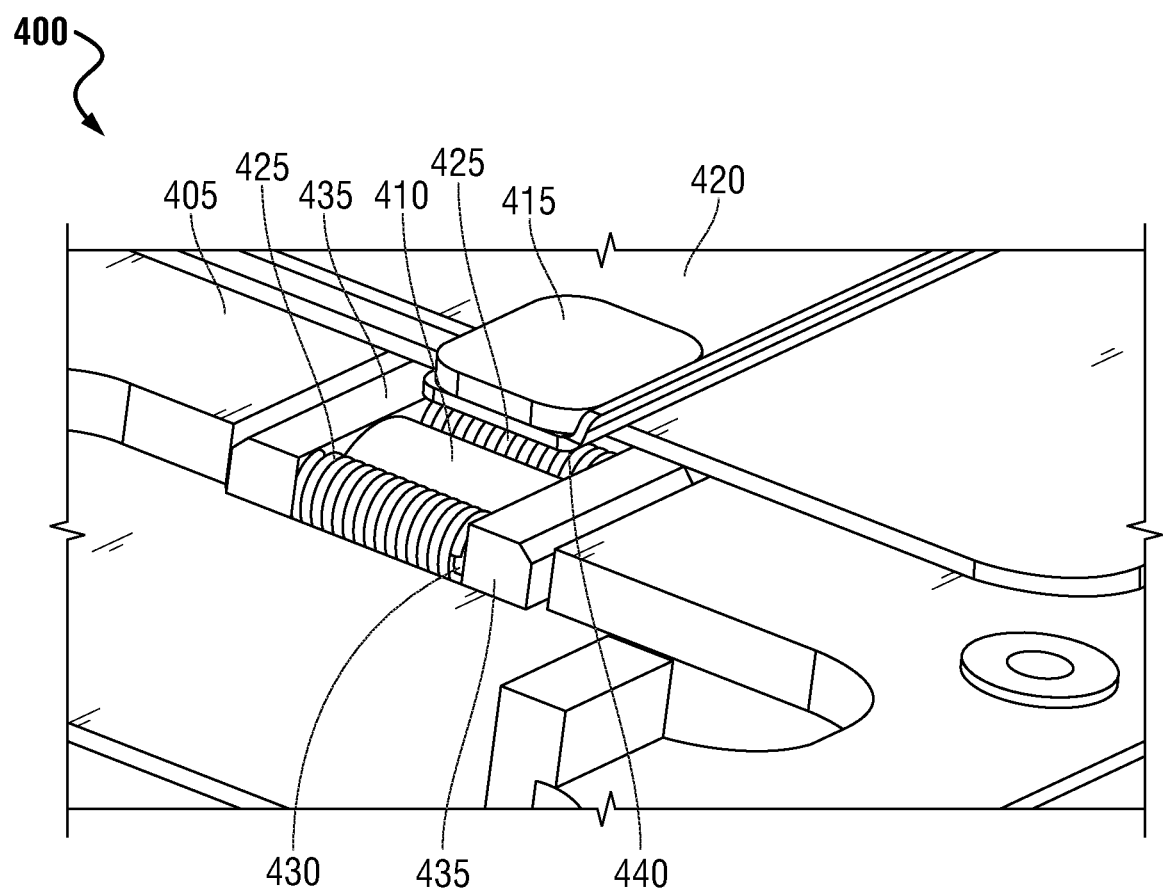
FIG. 4A is a perspective view of a trackpad system that includes an electro-permanent magnet (EPM) interfacing with a trackpad according to an embodiment of the present disclosure.

FIG. 4A is a perspective view of a trackpad system 400 that includes and EPM 405 interfacing with a permanent magnet 415 operatively coupled to a trackpad 420 according to an embodiment of the present disclosure. FIG. 4A has an orientation showing the trackpad 420 upside down such that the c-cover of the information handling system is on the bottom. This is done so that the detail of the trackpad system 400 is more easily viewed. The trackpad system 400 shown in FIG. 4 shows a single EPM 405 interfacing with a single permanent magnet 415. However, the present description contemplates that multiple sets of EPMs 405 and permanent magnets 415 may be formed in the trackpad system 400 and the description herein is not meant to be limiting in this respect.

The trackpad system 400 may include the trackpad 420 as described herein with a flange 440 jutting out from the trackpad 420 or a substrate or support plate of the trackpad 420. This flange 440 may be formed at a location where the permanent magnet 415 is to be operatively coupled. Adhesive or a mechanical coupling such as a screw or clip may be used to operatively couple permanent magnet 415. In the location of the flange 440 and the permanent magnet 415 operatively coupled thereto may be within a magnetic field or a magnetic field to be created by the EPM 405. In the example presented in FIG. 4A, the flange 440 and permanent magnet 415 are placed directly below the EPM 405, since the perspective view of FIG. 4A shows the trackpad 420 configuration upside down such that the c-cover of an information handling system would be on the bottom. It is noted however that the present specification contemplates that the permanent magnet 415 may be placed at a location other than below the EPM 405 or the EPM 405 may be oriented at a different location relative to the flange 440.

The EPM 405 may be operatively coupled to any portion of the trackpad system 400 including, but not limited to, a chassis of an information handling system, such as the underside of the c-cover as shown, and that the trackpad system 400 is associated with or part of a housing of the trackpad system 400 itself. In any embodiment herein, however, the placement of the EPM 405 allows for the free movement of the flange 440, the permanent magnet 415, and trackpad 420 relative to the EPM 405. However, trackpad support plate or flange 440 may be restricted as to deflection movements by the information handling system chassis, trackpad housing, or trackpad frame in some embodiments. At the lower end of deflection, a contact switch or pressure sensor may engage the trackpad support plate or flange 440 to record a "click" actuation as well as restrict further deflection.

In an embodiment, a multi-level EPM 405 may include a single high-coercivity magnet 410 surrounded by a plurality of low-coercivity magnets 430. As described herein, each of the low-coercivity magnets 430 may have an electrically conductive wire 425 coiled around its respective low-coercivity magnets 430. Each of the electrically conductive wires 425 may be individually addressed by a processor in order to individually send a current pulse across the electrically conductive wire 425. In the embodiments presented herein, each of the polarities of the individual low-coercivity magnets 430 may be aligned with the high-coercivity magnet 410 in order to increase, incrementally, the magnitude of the magnetic field produced by the multi-level EPM 405.

Figure 4B:
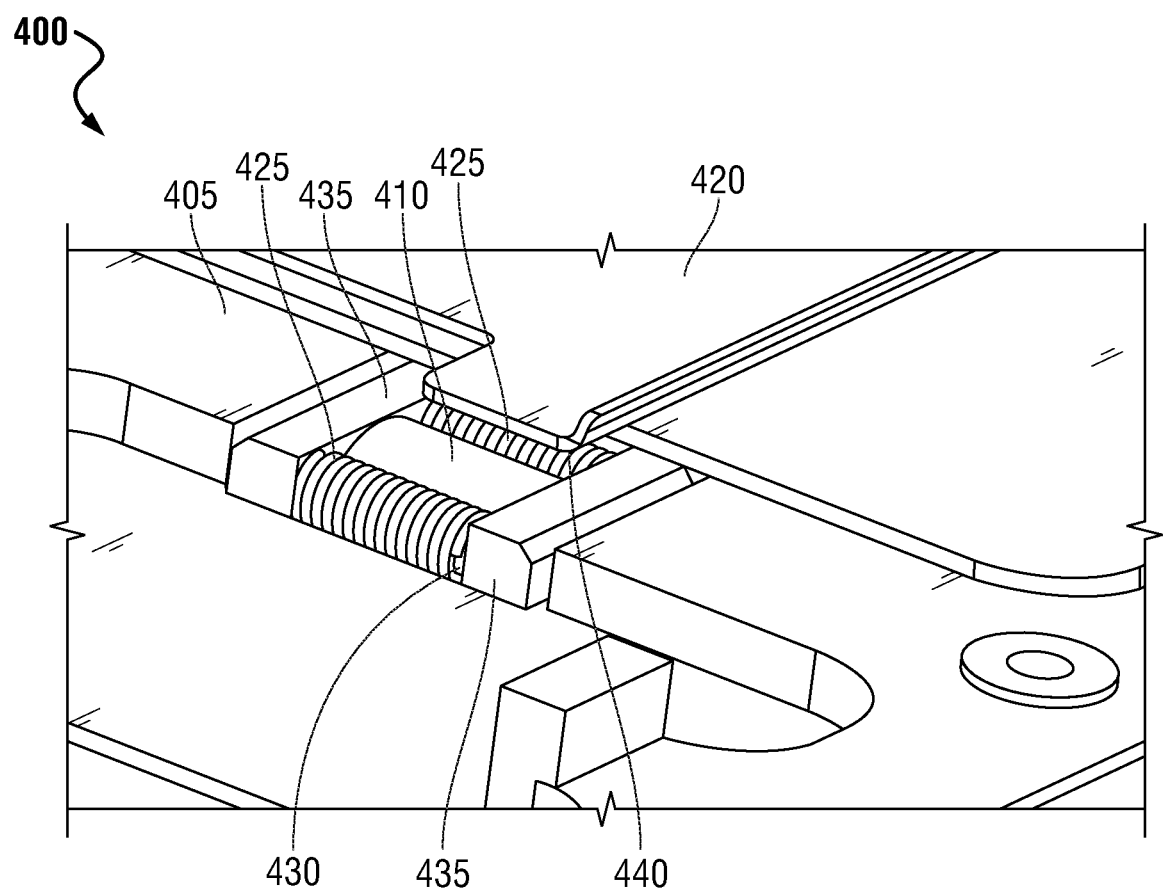
FIG. 4B is a perspective view of a trackpad system that includes an electro-permanent magnet (EPM) interfacing with a trackpad according to an embodiment of the present disclosure.

FIG. 4B is a perspective view of a trackpad system 400 that includes and EPM 405 interfacing with a trackpad layer coupled to a trackpad 420 according to an embodiment of the present disclosure. As with FIG. 4A, the orientation shows the trackpad 420 upside down such that the c-cover of the information handling system is on the bottom. This is done so that the detail of the trackpad system 400 is more easily viewed. As described herein, in an embodiment, the EPM 405 may magnetically interact with a metallic layer and/or ferromagnetic layer of the trackpad 420 similar to that described above in connection with FIG. 4A without the presence of a permanent magnet placed on the flange 440.

The trackpad system 400 may include the trackpad 420 as described herein with a flange 440 jutting out from the trackpad 420 or a substrate or support plate of the trackpad 420. This flange 440 may be formed at a location where flange 440 is to magnetically interface with the EPM 405. In the location of the flange 440 the EPM 405 may be placed. In the example presented in FIG. 4B, the flange 440 is placed directly below the EPM 405 (shown as above in the upside down orientation of FIG. 4B), however the present specification contemplates that the flange 440 may be placed at a location other than below the EPM 405 such as in another orientation within a magnetic proximity of the EPM 405. Further, EPM 405 may be located elsewhere within the information handling system chassis, such as below flange 440 which would appear above flange 440 in the upside down orientation shown in FIG. 4B.

The EPM 405 may be operatively coupled to any portion of the trackpad system 400 including, but not limited to, a chassis of an information handling system that the trackpad system 400 is associated with or a housing of the trackpad system 400 itself. In any embodiment herein, however, the placement of the EPM 405 allows for the free movement of the flange 440 and trackpad 420 relative to the EPM 405. However, trackpad support plate or flange 440 may be restricted as to deflection movements by the information handling system chassis, trackpad housing, or trackpad frame in some embodiments. At the lower end of deflection, a contact switch or pressure sensor may engage the trackpad support plate or flange 440 to record a "click" actuation as well as restrict further deflection.

In an embodiment, a multi-level EPM 405 may include a single high-coercivity magnet 410 surrounded by a plurality of low-coercivity magnets 430. As described herein, each of the low-coercivity magnets 430 may have an electrically conductive wire 425 coiled around its respective low-coercivity magnets 430. Each of the electrically conductive wires 425 may be individually addressed by a processor in order to individually send a current pulse across the electrically conductive wire 425. In the embodiments presented herein, each of the polarities of the individual low-coercivity magnets 430 may be aligned with the high-coercivity magnet 410 via application of the current to the electrically conductive wires 425 so as to increase, incrementally, the magnitude of the magnetic field produced by the multi-level EPM 405.

Figure 4C:
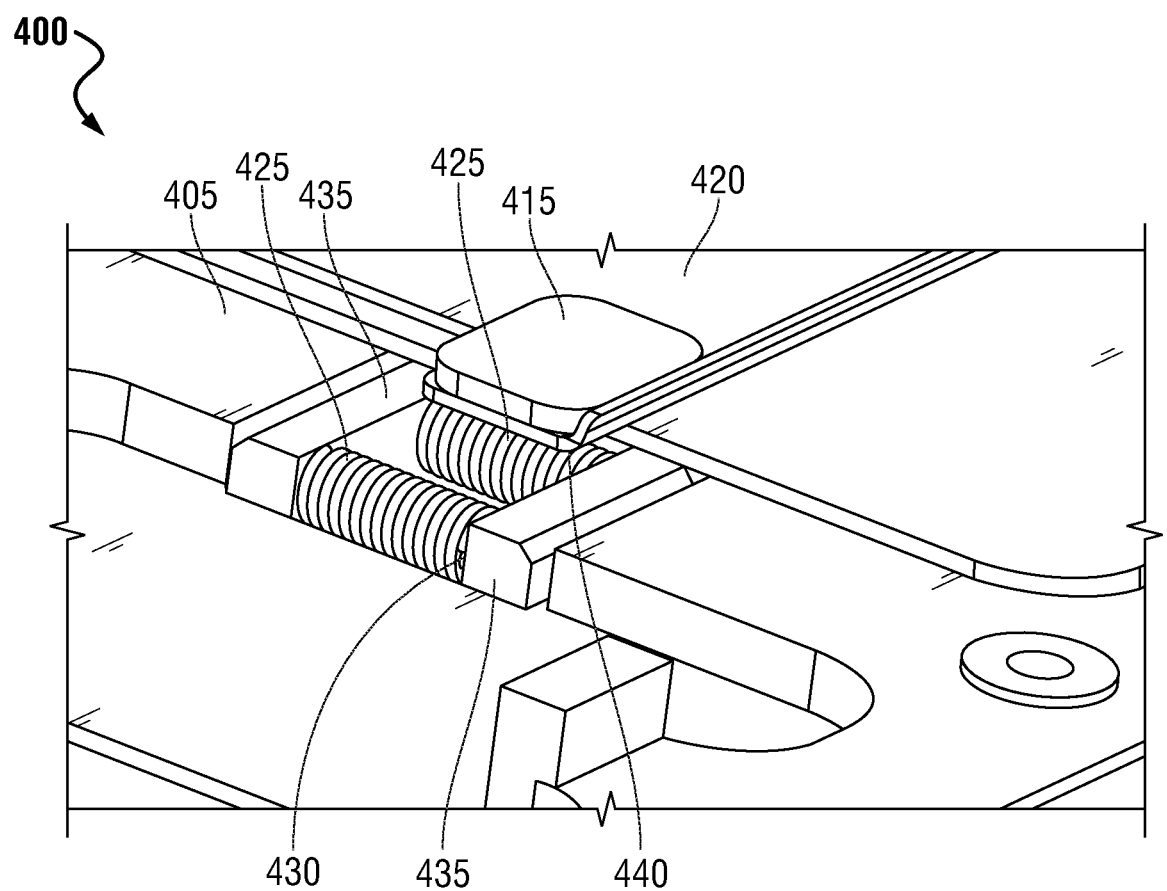
FIG. 4C is a perspective view of a trackpad system that includes an electro-permanent magnet (EPM) interfacing with a trackpad according to an embodiment of the present disclosure.

FIG. 4C is a perspective view of a trackpad system 400 that includes and EPM 405 interfacing with a trackpad layer coupled to a trackpad 420 according to an embodiment of the present disclosure. As with FIGS. 4A and 4B, the orientation shows the trackpad 420 upside down such that the c-cover of the information handling system is on the bottom. This is done so that the detail of the trackpad system 400 is more easily viewed. As described herein, in an embodiment, the EPM 405 may magnetically interact with a metallic layer and/or ferromagnetic layer of the trackpad 420 similar to that described above in connection with FIG. 4A or may interface with a permanent magnet as described in connection with FIG. 4A. The trackpad system 400 may include the trackpad 420 as described herein with a flange 440 jutting out from the trackpad 420 or a substrate or support plate of the trackpad 420. This flange 440 may be formed at a location where flange 440/permanent magnet operatively coupled to the flange is to magnetically interface with the EPM 405. In the location of the flange 440 the EPM 405 may be placed. In the example presented in FIG. 4C, the flange 440 is placed directly below the EPM 405 in the upside down oriented figure, however the present specification contemplates that the flange 440 may be placed at any location relative to the EPM 405 such as above or within a magnetic proximity of the EPM 405. Further, EPM 405 may be placed in a different location in the chassis of the information handling system, such as not under the bottom surface of the c-cover. EPM 405 may be mounted above the d-cover in an example embodiment.

The EPM 405 may be operatively coupled to any portion of the trackpad system 400 including, but not limited to, any orientation on or within the chassis of an information handling system that the trackpad system 400 is associated with or as part of the housing of the trackpad system 400 itself. In any embodiment herein, however, the placement of the EPM 405 allows for the free movement of the flange 440 and trackpad 420 relative to the EPM 405. However, trackpad support plate or flange 440 may be restricted as to deflection movements by the information handling system chassis, trackpad housing, or trackpad frame in some embodiments. At the lower end of deflection, a contact switch or pressure sensor may engage the trackpad support plate or flange 440 to record a "click" actuation as well as restrict further deflection.

In an embodiment, a multi-level EPM 405 may include a plurality of low-coercivity magnets 430 without the permanent magnet as described in connection with FIG. 4B. As described herein, each of the low-coercivity magnets 430 may have an electrically conductive wire 425 coiled around its respective low-coercivity magnets 430. Each of the electrically conductive wires 425 may be individually addressed by a processor in order to individually send a current pulse across the electrically conductive wire 425. In the embodiments presented herein, each of the polarities of the individual low-coercivity magnets 430 may be selectively aligned together via application of the current to the electrically conductive wires 425 so as to increase, incrementally, the magnitude of the magnetic field produced by the multi-level EPM 405. In particular, the one or more EPM low-coercivity magnets 430 may be switched in polarity to align with the permanent magnet 415 or be opposite to the permanent magnet 415 to cause repelling or attractive force respectively. Further, the low-coercivity magnet 430 and permanent magnet 415 polarities may be aligned or opposite in either the X-Y plane of FIG. 4C in some embodiments as shown or in the Z plane in other embodiments.

Figure 5A:
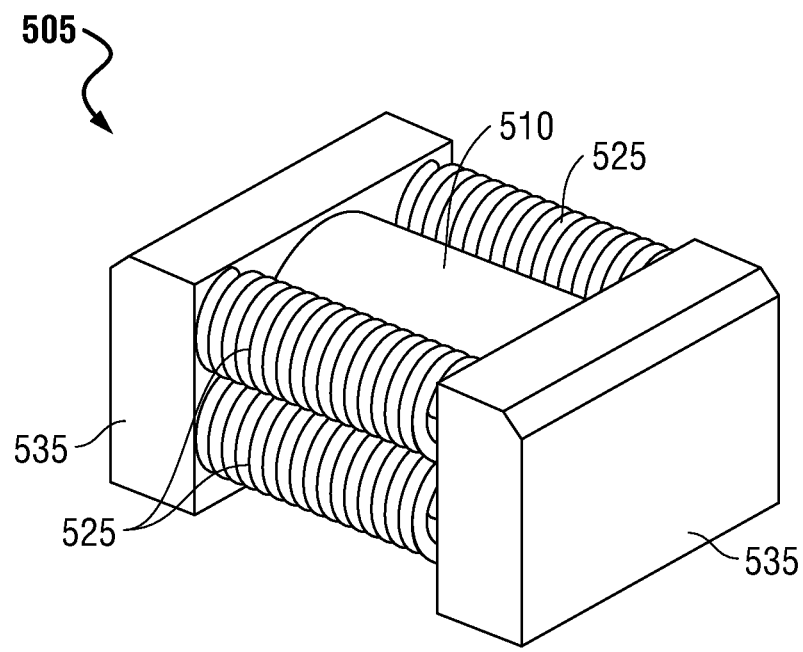
FIG. 5A is a perspective view of a multi-level EPM that may be used with an I/O device according to an embodiment of the present disclosure.
Figure 5B:
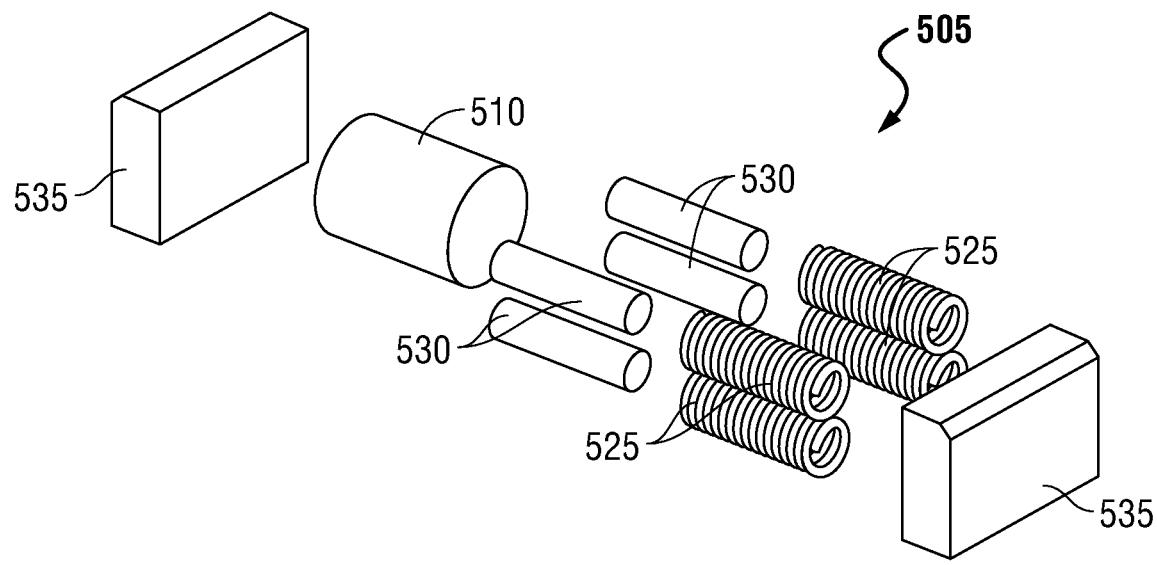
FIG. 5B is an exploded view of a multi-level EPM that may be used with an I/O device according to an embodiment of the present disclosure.
Figure 5C:
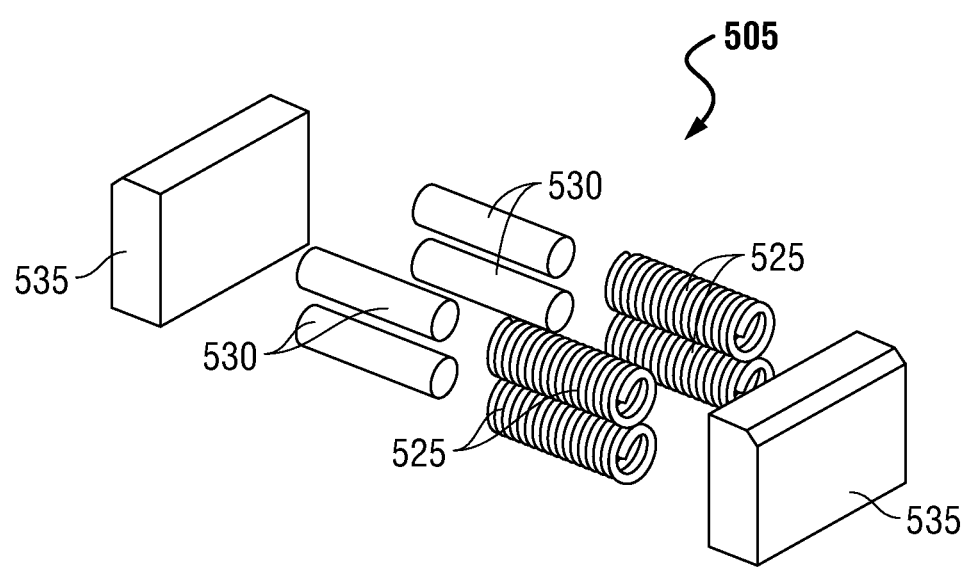
FIG. 5C is an exploded view of another multi-level EPM that may be used with an I/O device according to an embodiment of the present disclosure.

FIGS. 5A, 5B, and 5C show more details of another example multi-level EPM according to an embodiment of the principles described herein. Specifically, FIG. 5A shows a perspective view and FIGS. 5B, and 5C are show two exploded views of the multi-level EPM 505, respectively, according to one or more embodiments of the present disclosure. Each of FIGS. 5A and 5B show a single high-coercivity magnet 510 surrounded by four low-coercivity magnets 530. Although FIGS. 5A and 5B show there to be a single high-coercivity magnet 510 and four low-coercivity magnets 530, this is meant merely as an embodiment. The present specification contemplates that more or less high-coercivity magnets 510 and/or low-coercivity magnets 530 may be used without going beyond the principles of the multi-level EPM 505 described herein.

As described herein, each of the low-coercivity magnets 530 include an electrically conductive wire 525 coiled around a length of the low-coercivity magnets 530. The electrically conductive wire 525, being wrapped around the shaft of the low-coercivity magnets 530, may selectively allow for the polarity of the individual low-coercivity magnets 530 to be switch. Specifically, as a current pulse is applied to an electrically conductive wire 525, the magnetic field created by the electrical current passed through the electrically conductive wire 525 may switch the polarity of the low-coercivity magnets 530 to align with the polarity of the high-coercivity magnet 510. In this example, the aligning of the polarities of the magnets 510, 530 causes the magnitude of the magnetic field to increase. In the case of the trackpad system 400 described in connection with FIG. 4, this may cause the permanent magnet 415 to be repelled from the EPM 405 thereby raising the flange 440 and trackpad 420 up and away from, for example, a switch used to register a "click" on the trackpad 420. Additionally, because the multi-level EPM 505 shown in FIGS. 5A and 5B includes four low-coercivity magnets 530, the polarity of each of these low-coercivity magnets 530 may be switched to align with the high-coercivity magnet 510 in order to increase the effects of the magnetic field on, for example, a permanent magnet such as 415 shown in FIG. 4 or on a steel flange of a scissor plate for a magnetic key assembly. This may be done in a step-wise manner in order to incrementally increase this magnetic field in order to increase the magnetic field produced by the multi-level EPM 505. In an embodiment, during operation of any multi-level EPM described herein, the multi-level EPM may initially be set to an "off" state by not applying any current to any of the electrically conductive wires 525 coiled around any of the low-coercivity magnets 530 when their polarities are opposite the high-coercivity magnet 510. However, as the polarity of each of the low-coercivity magnets 530 is switched to align with the polarity of the high-coercivity magnet 510, the magnetic flux and, consequently, the magnetic field is increased. As a consequence of the incremental increase in the magnetic field, the magnetic force produced between the multi-level EPM 505 and the permanent magnet coupled to the trackpad increases as well. Consequently, the actuation force used to press against the trackpad 420 by a user is also incrementally increased. This characteristic of the incremental increase in magnetic field produced by the multi-level EPM 505 resulting the incremental increase in actuation force allows for the multi-level EPM to customize the actuation force by selectively turning "on" some low-coercivity magnets 530 while leaving some of the low-coercivity magnets 530 in and "off" state. This ability to customize the actuation force allows a user to better customize the tactile interaction with the information handling system thereby increasing the usability of the information handling system and user satisfaction. It may even set to help reject errant click in one example embodiment by selecting a high-level repelling force requiring greater actuation to register a click input in one example embodiment.

In an example, the magnitude of the increase of the magnetic field produced by the multi-level EPM 505 via selective activation of the individual low-coercivity magnets 530 may depend on a number of factors. These factors may include the number of low-coercivity magnets 530 present in the EPM 505, the axial length of the low-coercivity magnets 530, the number of coils of the electrically conductive wire 525 coiled around the individual low-coercivity magnets 530, and the amount of current applied to any given electrically conductive wire 525, among other factors.

In an example, the EPM 505 may include a number of shunts 535 made of a ferromagnetic material. The shunts 535 may house the high-coercivity magnet 510, low-coercivity magnets 530, and electrically conductive wires 525 as shown specifically in FIG. 5A. Additionally, the shunts 535, being made of ferromagnetic material may help to propagate the magnetic field of the multi-level EPM towards the permanent magnet 415.

FIG. 5C is, like FIGS. 5A and 5B, a perspective exploded view of an EPM 505 according to a separate embodiment described herein. In this embodiment, however, the EPM 505 does not include a high-coercivity magnet. Instead, the EPM 505 of FIG. 5C includes four low-coercivity magnets 530. Although FIG. 5C shows that the EPM 505 includes four low-coercivity magnets 530, the present description contemplates that the EPM 505 may include any number of low-coercivity magnets from 1 to infinity. As described herein, each of the low-coercivity magnets 530 include an electrically conductive wire 525 coiled around a length of the low-coercivity magnets 530. The electrically conductive wire 525, being wrapped around the shaft of the low-coercivity magnets 530, may selectively allow for the polarity of the individual low-coercivity magnets 530 to be switch. Specifically, as a current pulse is applied to an electrically conductive wire 525, the magnetic field created by the electrical current passed through the electrically conductive wire 525 may switch the polarity of the low-coercivity magnets 530. The switched polarity of the low-coercivity magnets 530 may align or misalign each of the polarities of the low-coercivity magnets 530 with respect to each other so as to increase/decrease, incrementally, the magnetic flux produced by the plurality of low-coercivity magnets 530 within the EPM 505.

In the case of the trackpad system 400 described in connection with FIG. 4, this may cause a permanent magnet 415 to be attracted to/repelled from the EPM 505 thereby raising/lowering the flange 440 and trackpad 420 up and away from/closer to, for example, a switch used to register a "click" on the trackpad 420. Additionally, because the multi-level EPM 505 shown in FIG. 5C includes four low-coercivity magnets 530 (or any other number of low-coercivity magnets), the polarity of each of these low-coercivity magnets 530 may be switched in order to increase/decrease the effects of the magnetic field on, for example, a permanent magnet such as 415 shown in FIG. 4C depending on polarity alignment or on a steel flange of a dive board associated with the trackpad. This may be done in a step-wise manner in order to incrementally increase/incrementally decrease this magnetic field in order to increase/decrease the magnetic field produced by the multi-level EPM 505. In an embodiment, during operation of any multi-level EPM described herein, the multi-level EPM may initially be set to an "off" state such that the polarities of the low-coercivity magnets 530 cancel. Thus, by not applying any current to any of the electrically conductive wires 525 coiled around any of the low-coercivity magnets 530 when their polarities are opposite with respect to each other for an even number of low-coercivity magnets yields no net magnetic force. However, as the polarity of each of the low-coercivity magnets 530 is switched to align with the polarity of any of the other low-coercivity magnets 530, the magnetic flux and, consequently, the magnetic field is increased or decreased accordingly. As more low-coercivity magnets 530 are aligned in polarity with a permanent magnet, repelling force may be increased. As more low-coercivity magnets 530 are aligned opposite with a permanent magnet, attractive force may be increased. As a consequence of the incremental increase/decrease in the magnetic field, the magnetic force produced between the multi-level EPM 505 and the permanent magnet coupled to the flange or the flange alone may be controlled with incremental increases in attraction or repelling. Consequently, the actuation force used to press against the trackpad 420 by a user is also incrementally increased. This characteristic of the incremental increase/decrease in magnetic field produced by the multi-level EPM 505 resulting the incremental increase/decrease in actuation force allows for the multi-level EPM to customize the actuation force by selectively turning "on" some low-coercivity magnets 530 in polarity re-alignment while leaving some of the low-coercivity magnets 530 in and "off" state or not switching the polarity. This ability to customize the actuation force allows a user to better customize the tactile interaction with the information handling system thereby increasing the usability of the information handling system and user satisfaction. It may even set to help reject errant click in one example embodiment by selecting a high-level repelling force requiring greater actuation to register a click input in one example embodiment or selecting a low-level repelling force requiring lesser actuation to register a click. Thus, the errant clicking may be prevented based on the location of the EPM 505 relative to the flange/permanent magnet (i.e., either below or above the flange/permanent magnet).

In an example, the magnitude of the increase/decrease of the magnetic field produced by the multi-level EPM 505 via selective activation of the individual low-coercivity magnets 530 may depend on a number of factors. These factors may include the number of low-coercivity magnets 530 present in the EPM 505, the axial length of the low-coercivity magnets 530, the number of coils of the electrically conductive wire 525 coiled around the individual low-coercivity magnets 530, and the amount of current applied to any given electrically conductive wire 525, among other factors.

In an example, the EPM 505 may include a number of shunts 535 made of a ferromagnetic material. The shunts 535 may house the low-coercivity magnets 530 and the electrically conductive wires 525 as shown specifically in FIG. 5C. Additionally, the shunts 535, being made of ferromagnetic material, may help to propagate the magnetic field of the multi-level EPM towards the permanent magnet 415 and/or flange of the touchpad.

Figure 6:
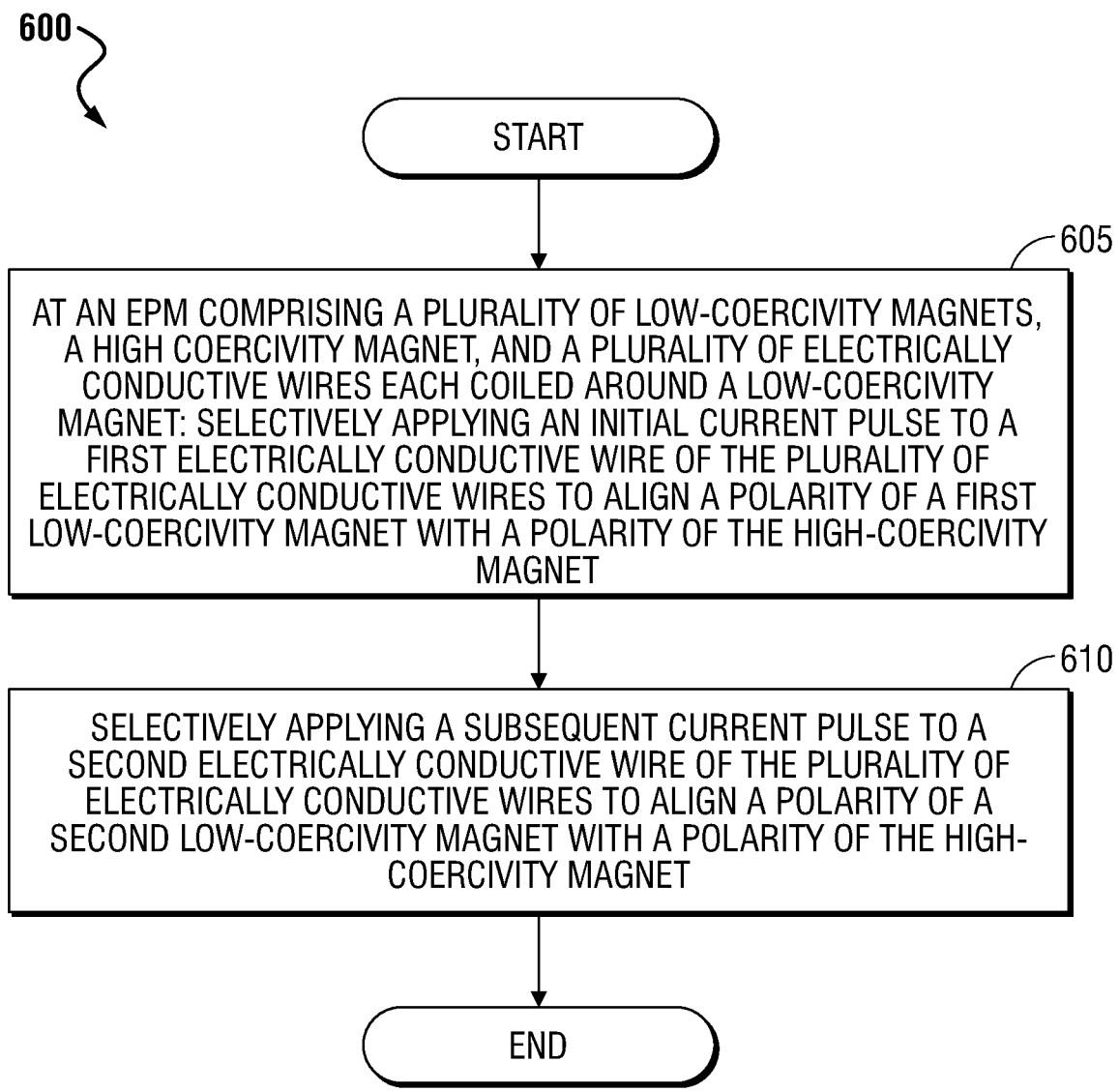
FIG. 6 is a flow diagram illustrating a method of activating a multi-level EPM according to an embodiment of the present disclosure.

FIG. 6. is a flow diagram illustrating a method 600 of activating a multi-level EPM of, for example, FIGS. 4A-C and FIGS. 5A-5C according to an embodiment of the present disclosure. The method 600 may begin with selectively applying at 605 an initial current pulse to a first electrically conductive wire of a plurality of electrically conductive wires to align a polarity of a first low-coercivity magnet with a polarity of the high-coercivity magnet. As described herein, the multi-level EPM may include a plurality of low-coercivity magnets, a high coercivity magnet, and a plurality of electrically conductive wires each coiled around the low-coercivity magnets. Thus, application at 605 of a current pulse to the first electrically conductive wire causes the polarity of the associated individual low-coercivity magnet to align with the polarity of the high-coercivity magnet thereby allowing for an initial incremental increase in magnitude of magnetic field produced by the multi-level EPM.

In the embodiment of FIGS. 4C and 5C, the EPM at 605 may not have a high-coercivity magnet in the middle of low-coercivity magnets, but only a plurality of low-coercivity magnets which may be aligned with a permanent or high coercivity magnet located in another part of the information handling system such as on a flange of a track pad dive board support. The low-coercivity magnet or magnets may be switched in polarity to align or oppose the separately located permanent or high coercivity magnet. As each low-coercivity magnet in a plurality of low-coercivity magnets has its polarity switched, the attraction force or repelling force may be incrementally increased. As described in embodiments herein, the attraction force or repelling force depends upon whether the polarities of the low-coercivity magnets are aligned opposite or aligned with the polarity of the separate permanent or high-coercivity magnet with which the EPM interacts.

The method shown in FIG. 6 may continue at 610 with selectively applying a subsequent current pulse to a second electrically conductive wire of the plurality of electrically conductive wires to align a polarity of a second low-coercivity magnet with a polarity of the high-coercivity magnet. In this example, the application 610 of the current pulse to the second electrically conductive wire aligns the polarity of the second low-coercivity magnet with that polarity of the high-coercivity magnet as well as the first low-coercivity magnet described herein. The alignment of the polarity of the second low-coercivity magnet with that of the polarity of the high-coercivity magnet increases the magnitude of the magnetic field of the multi-level EPM to a second incremental on-state magnetic level. As such, this increases the ability of the EPM to attract or repel, selectively, the permanent magnet coupled to the substrate of the trackpad or another ferromagnetic element in an I/O device such as a metal flange in a touchpad.

In an embodiment, the method 600 may continue with selectively applying a current pulse to each additional individual electrically conductive wire 525 coiled around any respective low-coercivity magnets within the multi-level EPM until a predefined magnitude of a magnetic field is realized. By way of example presented in certain embodiments described herein, the application of a current selectively to four distinct electrically conductive wires may allow for four incremental increases in the magnitude of the magnetic field of the multi-level EPM above an off-state. This allows for a user and/or information handling system to set an actuation force used to actuate the trackpad by adjustment of the magnitude of the magnetic field of the multi-level EPM and its rejection of a corresponding permanent magnet. In an embodiment, a predefined magnitude of magnetic field may be representative of, in an example, a user-defined actuation force to be achieved at the trackpad. Accordingly, the information handling system may include a look-up table that includes data descriptive of how and which polarities of the low-coercivity magnets are to be activated (i.e., switch to align with the polarity of the high-coercivity magnet) via application of a current pulse to their respective electrically conductive wires. As such, user-defined actuation data input by the user may be coordinated with how may low-coercivity magnets 530 are available to be activated.

Returning to the embodiment of FIGS. 4C and 5C, the EPM at 610 may not have the high-coercivity magnet, but another of the plurality of low-coercivity magnets which may have polarity switched to be opposite to or aligned with a permanent or high coercivity magnet located in another part of the information handling system such as on a flange of a track pad dive board support. In such a case, the switched polarity of the low-coercivity magnets may further increment the repelling or attractive force relative to the separately located permanent or high coercivity magnet.

In an embodiment, the trackpad of the information handling system may include multiple EPMs that interface with a respective number of permanent magnets coupled to the trackpad or substrate of the trackpad. In this example, the actuation force used to actuate the trackpad at two or more different locations on the trackpad may be made to differ so that the user may distinguish between the two locations via tactile interaction. In either case, both EPMs may be customized by the user using user-defined actuation data in order to further customize the use and feel of the trackpad to the user.

Figure 7:
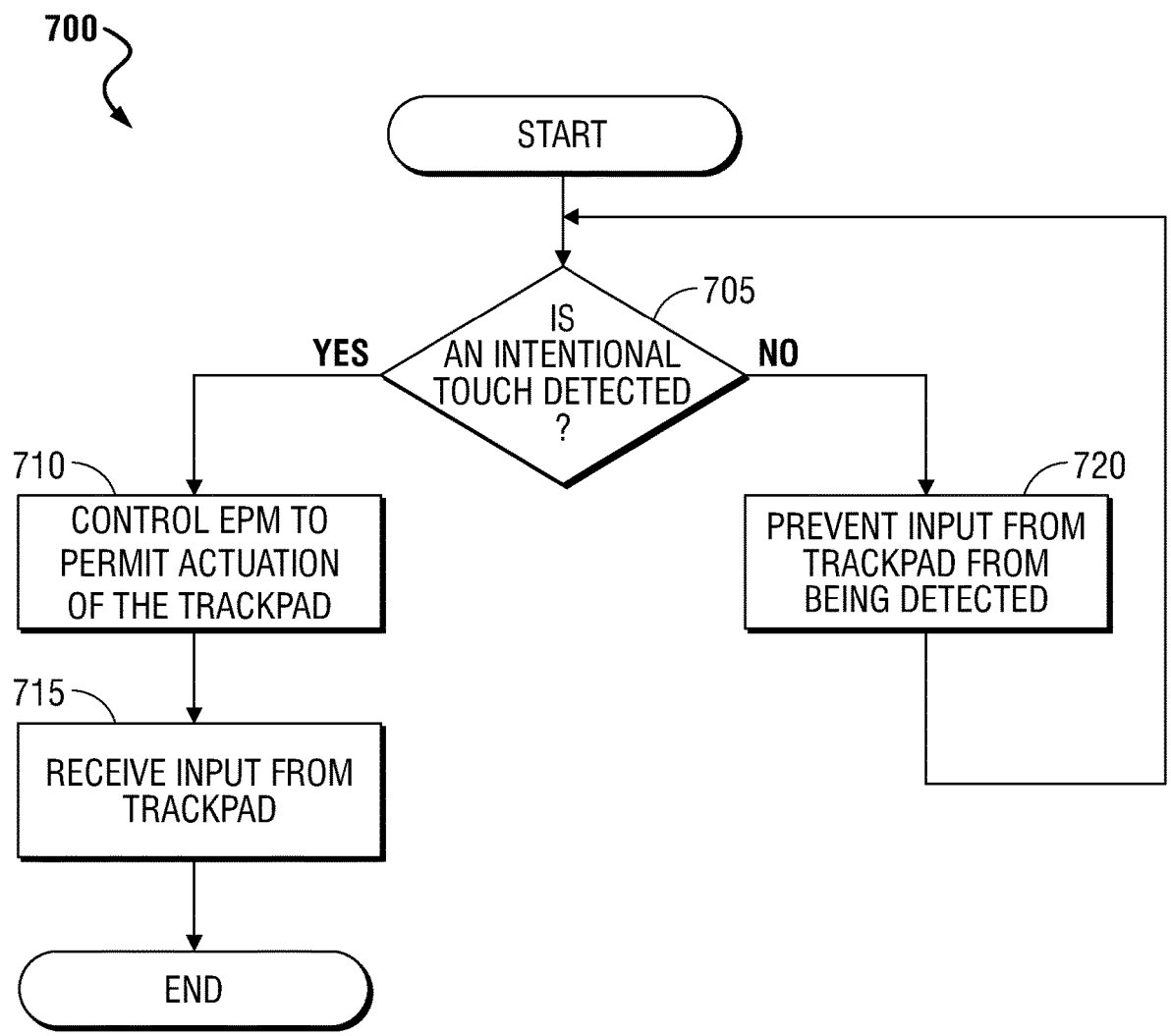
FIG. 7 is a flow diagram illustrating a method of activating the EPM according to an embodiment of the present disclosure.

FIG. 7 is a flow diagram illustrating a method 700 of activating an EPM used with an I/O device according to an embodiment of the present disclosure. The method 700 may begin with determining at 705 whether a touch has been detected at the trackpad. As described herein, the trackpad may include, in some embodiments, a touch sensor layer that is capable of detecting a touch from a human such as via a finger. In this example, the trackpad may include a capacitive sensing surface or a resistive touch sensor in some embodiments. Further, the I/O device may also be a touch sensitive display screen in some embodiments. In either case, a processor of the information handling system described herein may receive input from the trackpad indicative of whether a touch is an intentional touch to a touch sensor layer of the I/O device such as the touch of the user's finger. Any other touch via, for example, an errant touch by a palm, the side of a user's hand or finger, or an object other than a user's finger, may also be detected as an errant touch. The nature of the touch may be detected based upon the area of touch and location of touch of the trackpad (or touchscreen) in some embodiments. For example, an area of touch indicating a palm or the side of a hand or finger may be larger than a touch received pursuant to a gesture from one or more fingers and may indicate an errant touch. Similarly, a location of a touch, such as at a lower or upper corner or along a side or the touchpad near a palm rest may indicate an errant touch.

In some embodiments, additional inputs may indicate an errant touch. In one embodiment, indication that a nearby keyboard is actively being used may be detected such that any touch to a portion of the trackpad or to particular portions of the trackpad or other I/O device may be determined to be an errant touch of the trackpad. In another embodiment, a touch sensor or proximity sensor may be utilized with a palm rest of areas around a trackpad or touch screen such that detecting presence of a user's palm or hand on a palm rest may be used to determine a received touch on the trackpad or touch screen is an errant touch.

In some embodiments, a flexing of a housing of the trackpad may cause the trackpad to register an errant touch or actuation of the trackpad. In this embodiment, the method may include determining at 705 whether a touch at a touch-sensitive location of the trackpad had been detected. In this embodiment where the flexing of the housing has caused the actuation, the input may be prevented at 720 from being detected. This prevention may include execution of computer-readable code and/or actuation of the EPMs as described herein. In an embodiment, the EPMs may activate the low-coercivity magnets in order to attract or repel the trackpad to or from the EPM so that physical movement of the trackpad is prevented unless and until a touch is detected at the trackpad. This prevents a palm, for example, of a user from actuating the trackpad when the weight of the user's palms may have inadvertently flexed the trackpad housing and/or trackpad itself to a point where a sensor or other actuation detector is present. Turning on an EPM may attract a permanent magnet or ferromagnetic flange within the EPM magnetic field in some embodiments. Doing so may lock the trackpad in an up position with an attractive force, or a down position with a repelling force, to prevent actuation of the dive board layer of the trackpad when the EPM is mounted under the c-cover of the information handling system in an example embodiment. The opposite orientation may also work where the EPM is situated under a permanent magnet to repel the trackpad and lock it from actuation.

In another embodiment, the EPM may have only one or more low-coercivity magnetic elements which may have polarities reversed with a current to coils around the low-coercivity magnets and be mounted under the c-cover of the information handling system. Changing the polarity of the one or more low-coercivity magnetic elements to a polarity opposite the polarity of a permanent magnet disposed on a ferromagnetic flange or otherwise disposed on a trackpad may lock the trackpad in an up position to the EPM preventing actuation. Similarly, repelling the permanent magnet with aligned polarity of the low-coercivity magnet or magnets may be used to lock the trackpad in a down position. In other embodiments, it is contemplated that the location of the EPM may change relative to the trackpad as described in various embodiments herein to cause a repelling force to lock the trackpad in an up position and an attractive force to lock the trackpad in a down position.

The method 700, may also prevent 720 input from the trackpad from being detected when it has been determined 705 that an intentional touch has not been detected at the trackpad. By way of example, the trackpad may be errantly touched or actuated by a palm, side or a hand or finger, or an inanimate object. This inanimate object may be any implement that is not, for example, a user's finger. As described herein, a surface of the trackpad may be capable of detecting, via capacitive changes or electrically resistive changes in a touch sensor layer of the trackpad, whether a touch at the trackpad is that of a user's finger or some other part of a hand or other object based on one or more factors including detected footprint of the touch, location of the touch, or duration of the touch. Several such factors may be used in determining an intentional touch versus an errant touch and combined with aspects such as sensing palms resting on a palmrest of the c-cover, active typing, or application currently operating on the information handling system. Where no intentional touch is determined at 705, the information handling system may prevent, at 720, input from the trackpad from being detected. In a specific example embodiment, the processor of the information handling system, after determining at 705 that the touch is not an intentional touch, the processor may indicate that any signals received by a switch or pressure sensor, for example, are to be ignored. In another example embodiment, capacitive touch inputs for cursor locations may be ignored as well. This prevents, at 720, any errant input caused by an errant touch to be registered by the processor.

In another embodiment, the information handling system may prevent, at 720, input from the trackpad from being detected by physically limiting or preventing the deflective movement of the trackpad. In this embodiment, a multi-level EPM may be activated with a maximum magnetic field being created. This maximum magnetic field may be created by switching the polarity of all of the low-coercivity magnets within the multi-level EPM so as to be aligned with the polarity of the high-coercivity magnet. In this embodiment, the polarities of each of the low-coercivity magnets may be switched to align with the polarity of the high-coercivity magnet by application of the current pulses to the individual electrically conductive wires coiled around the low-coercivity magnets as described herein.

In such an embodiment, the information handling system may prevent input from the trackpad from being detected by physically moving the permanent magnet and the trackpad away from the switch contact by preventing or restricting any deflective movement of the trackpad. For example, the electropermanent magnet trackpad control system may lock the trackpad dive board in an up position, or a down position, depending on location of the EPM. In another particular embodiment, the magnetic field may be increased by an amount to cause an attracting force, or a repelling force, depending on location of the EPM relative to a permanent magnet to increase the force needed to register a click input such that inadvertent click inputs may occur less, but a click input is still available with enough input actuation force. As described herein, the contact switch, pressure sensor, or similar mechanism is be placed in a location relative to the trackpad so as to detect the downward deflective movement of the trackpad and register a click input. In this embodiment, when an intentional touch is not detected at 705, the contact switch or other sensor may be physically isolated from a click input by deflection of the trackpad so that it may not detect the deflective movement of the trackpad without force to overcome the highest magnetic repelling force of the multi-level EPM.

The method 700 may continue with, when it has been determined that an intentional touch has been detected at 705, the information handling system may activate the EPM as described herein. In this example, the activation of the EPM may activate one or more of the low-coercivity magnets via application of a current to an electrically conductive wire coiled around the low-coercivity magnets depending on if a multi-level EPM is used in some embodiments. This, as described herein, causes the polarities of the low-coercivity magnets to be selectively aligned with the polarity of a high-coercivity magnet thereby increasing the magnetic field produced by the EPM such that it repels a permanent magnet coupled to a surface of the trackpad. In this example, the magnetic field produced by the multi-level EPM may be incrementally increased so as to modify an actuation force needed to actuate the trackpad for a click switch function as described herein.

In an embodiment, the EPM may have only one or more low-coercivity magnets whose polarities may be altered relative to a permanent magnet polarity disposed on the trackpad dive board. In another embodiment, the EPM may also have at least one high-coercivity magnet such that changing the polarity of one or more low-coercivity magnets may turn off the EPM via cancellation with the high-coercivity magnet(s). Neutralizing the EPM magnetic field by turning it off will provide no magnetic field over a ferromagnetic flange or disposed permanent magnet by the EPM and provide for actuation of the trackpad. In another aspect, a series of low-coercivity magnets may have polarities changed to incrementally increase or decrease the magnetic force over the trackpad and to set the actuation force of the trackpad.

Additionally, where the EPM has been activated at 710 to permit trackpad actuation, the processor of the information handling system may receive input from the trackpad at 715. As described herein, the trackpad may be associated with a switch that, when the trackpad is actuated by a user to click input, it sends a signal to the processor of the information handling system indicating that the trackpad has been actuated. Additionally, the trackpad may also receive X-Y location input or gesture input via the touch sensor layer such as a capacitive touch sensor. In this example, the processor, by detection of a user's touch, accepts the signal from the switch as a legitimate actuation of the trackpad at 715. At this point, the process may end although the trackpad or touchscreen system may continue to accept the above forms of input from a user.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. Note that an information handling system can include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

The blocks of the flow diagrams of FIG. 6 and FIG. 7 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system, comprising:
a processor to receive user input from a trackpad at the information handling system; and
an electropermanent magnet control system to control the activation of an electropermanent magnet (EPM) magnetically couplable to a diveboard structure of the trackpad to set a resistive actuation force for a click input to the trackpad, where a pulse of current in a first direction aligns the magnetic field of a low-coercivity magnet with a proximate high-coercivity magnet for an increased magnetic state and a pulse of current in a second direction switches magnetic field of the low-coercivity magnet counter to the high-coercivity magnet magnetic field.

2. The information handling system of claim 1, wherein the EPM is a multi-level EPM comprising a high-coercivity magnet and a plurality of lower coercivity magnets.

3. The information handling system of claim 1, wherein the electropermanent magnet control system receives user input descriptive of a setting for the resistive actuation force of the trackpad used by the user to actuate the trackpad.

4. The information handling system of claim 1, wherein the electropermanent magnet control system controls the resistive actuation force of the trackpad used by the user to actuate the trackpad by selectively aligning each of a magnetic field of a plurality of low-coercivity magnets with a magnetic field of a high-coercivity magnet within the EPM to generate a magnetic field over the trackpad.

5. The information handling system of claim 1, wherein the trackpad comprises a permanent magnet operatively coupled to a flange formed on the trackpad such that the permanent magnet is disposed over the EPM by the flange.

6. The information handling system of claim 1, wherein the EPM is a multi-level EPM comprising a plurality of low-coercivity magnet to set polarity levels of the EPM to magnetically interact with the trackpad comprising a permanent magnet having a permanent magnet polarity.

7. The information handling system of claim 1, wherein the electropermanent magnet control system detects an errant touch of the trackpad and selects a magnetic level of a multi-level EPM to interact with the diveboard structure of the trackpad such that the resistive actuation force increases to prevent inadvertent click inputs.

8. A trackpad system, comprising:
a substrate having a touch sensing layer to receive input from a user;
a switch to detect deflective movement of the substrate as a user actuates the trackpad system;
a permanent magnet operatively coupled to a portion of the substrate having a permanent magnet polarity; and
an electropermanent magnet (EPM) including a low-coercivity magnet having an electrically conductive wire coiled around the low-coercivity magnet to receive a first electrical current pulse to adjust the polarity of the low-coercivity magnet relative to the permanent magnet to generate an EPM magnetic flux to interact with the permanent magnet to set a resistive actuation force for a click input to the trackpad, where a pulse of current in a first direction aligns the magnetic field of the low-coercivity magnet with a proximate high-coercivity magnet for an increased magnetic state and a pulse of current in a second direction switches magnetic field of the low-coercivity magnet counter to the high-coercivity magnet magnetic field.

9. The trackpad system of claim 8 further comprising:
the EPM having a plurality of low-coercivity magnets each having an electrically conductive wire coiled around the low-coercivity magnet to receive electrical current pulses to adjust the polarity of the low-coercivity magnets relative to the permanent magnet polarity.

10. The trackpad of claim 9, wherein the polarities of the low-coercivity magnets are selectively aligned opposite to the permanent magnet polarity in order to increase, incrementally, the resistive actuation force used by the user to actuate the trackpad depending on the number of low-coercivity magnets oppositely aligned.

11. The trackpad system of claim 8 further comprising:
a flange formed on the substrate onto which the permanent magnet is operatively coupled to dispose the permanent magnet to magnetically interface with the EPM.

12. The trackpad system of claim 8, wherein the EPM is coupled to a chassis of an information handling system associated with the trackpad.

13. The trackpad system of claim 8, comprising a number of flanges formed on the substrate onto which the permanent magnets are operatively coupled wherein the flanges overhang a past an edge of a housing of the trackpad to prevent the trackpad from rising above the housing.

14. A method of controlling a multilevel electro-permanent magnet (EPM) of a trackpad assembly of an information handling system, comprising:
at the multilevel EPM comprising a plurality of low-coercivity magnets- and a plurality of electrically conductive wires each coiled around a low-coercivity magnet:
selecting a magnetic level from a plurality of magnetic levels for the multilevel EPM by applying a selected number of current pulses to the plurality of electrically conductive wires to select a number of the plurality of low-coercivity magnets for polarity alignment with a high coercivity magnet or the EPM or to oppose polarity alignment of the high-coercivity magnet disposed on the trackpad assembly to set the magnetic level of the multilevel EPM, where the selected magnetic level may be used to adjust resistive actuation force for a click input to the trackpad assembly, where a pulse of current in a first direction aligns the magnetic field of one or more of the plurality of the low-coercivity magnets with the high-coercivity magnet for an increased magnetic state and a pulse of current in a second direction switches magnetic field of the one of a plurality of low-coercivity magnets counter to the high-coercivity magnet magnetic field.

15. The method of claim 14, comprising determining if an intentional touch is detected at the trackpad assembly and:
when an intentional touch is detected, receiving input from the trackpad assembly at a processor of the information handling system; and
when an errant touch is detected, preventing any input from the trackpad assembly to be received at a processor of the information handling system.

16. The method of claim 15, wherein detecting the errant touch occurs when a sensor in a palm rest near the trackpad assembly detects a touch or proximity of a user's hand.

17. The method of claim 14, wherein application of any current to any electrically conductive wire causes an attractive force to be exerted onto a diveboard structure of the trackpad assembly to generate the resistive actuation force when the multilevel EPM is disposed under the c-cover of an information handling system.

18. The method of claim 15, wherein detecting the errant touch occurs when a touch sensor layer of the trackpad assembly detects a touch indicating a palm or side of user's hand.

19. The method of claim 15, wherein detecting the errant touch causes a selection of a magnetic level of the multi-level EPM to lock the trackpad assembly in an up position to prevent an errant click.

20. The method of claim 15, wherein detecting the errant touch causes the multi-level EPM to set the polarity of the plurality of low-coercivity magnets to oppose a permanent magnet disposed on the trackpad assembly to lock in an up position.

* * * * *